(12) United States Patent
Thomson et al.

(10) Patent No.: US 6,507,619 B1
(45) Date of Patent: Jan. 14, 2003

(54) DECODING SYSTEM AND METHOD FOR DIGITAL COMMUNICATIONS

(75) Inventors: John S. Thomson, Santa Clara, CA (US); Paul J. Husted, Mountain View, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 09/535,902

(22) Filed: Mar. 24, 2000

(51) Int. Cl.$^7$ .................................................. H03D 1/00
(52) U.S. Cl. ......................................................... 375/241
(58) Field of Search ................................. 375/262, 265, 375/341, 261; 714/708, 759, 760, 791, 792, 793, 794, 796, 822

(56) References Cited

U.S. PATENT DOCUMENTS

| | | | | |
|---|---|---|---|---|
| 4,309,772 A | | 1/1982 | Kloker et al. ................ | 375/317 |
| 4,520,490 A | | 5/1985 | Wei ............................. | 375/246 |
| 5,363,408 A | * | 11/1994 | Paik et al. ................... | 375/261 |
| 5,812,613 A | | 9/1998 | Zogg ............................ | 375/343 |
| 6,061,823 A | * | 5/2000 | Nara ............................ | 714/758 |
| 6,125,831 A | * | 10/2000 | Yasui et al. ................. | 123/674 |
| 6,269,129 B1 | * | 7/2001 | Rhee et al. .................. | 375/341 |

FOREIGN PATENT DOCUMENTS

| | | |
|---|---|---|
| EP | 0 700 189 A1 | 7/1995 |
| EP | 0 827 298 A2 | 9/1997 |
| EP | 0 827 300 A2 | 9/1997 |

OTHER PUBLICATIONS

Sari, et al., "Frequency–domain equalization of mobile radio and terrestrial broadcast channels" (IEEE 0–7803–1820–X/94, pp. 1–5).

* cited by examiner

Primary Examiner—Chi Pham
Assistant Examiner—Emmanuel Bayard
(74) Attorney, Agent, or Firm—Pillsbury Winthrop LLP

(57) ABSTRACT

A Viterbi decoding system interprets bits in received QAM constellations as many-valued parameters rather than binary valued parameters. It performs the Viterbi algorithm using these many-valued parameters to provide results superior to hard decision decoding. Rather than applying a hard 0–1 function to the QAM data, the system uses a non-stepped linear or curved transfer function to assign values to the bits. This results in performance superior to pure hard decision decoding and approaches that of soft decision decoding; moreover, it is applicable in many situations where soft decision decoding cannot be used.

26 Claims, 8 Drawing Sheets

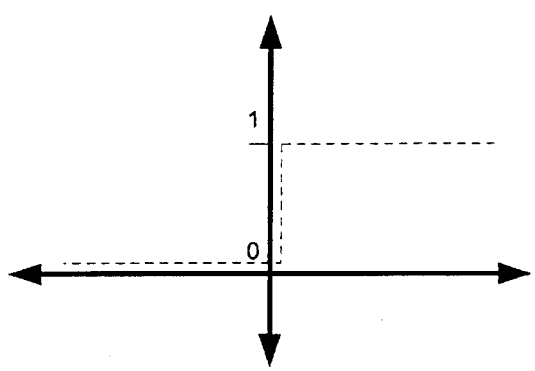
FIG. 7A
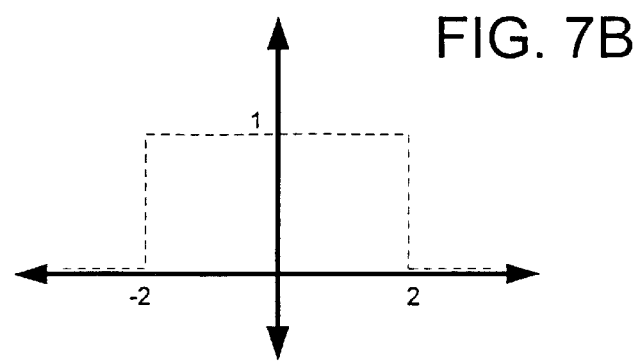
FIG. 7B
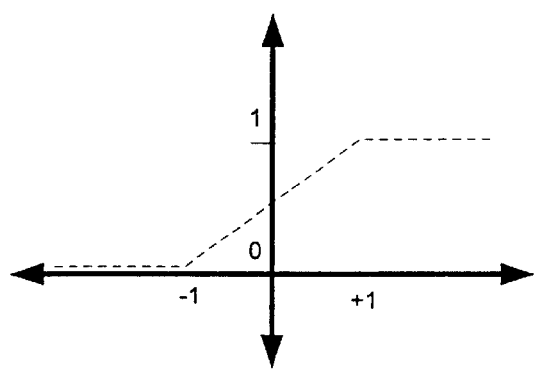
FIG. 8A
FIG. 8B
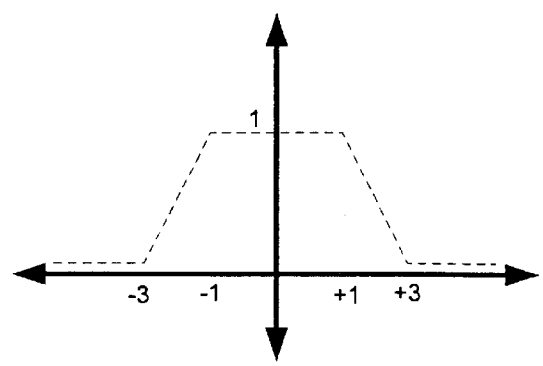

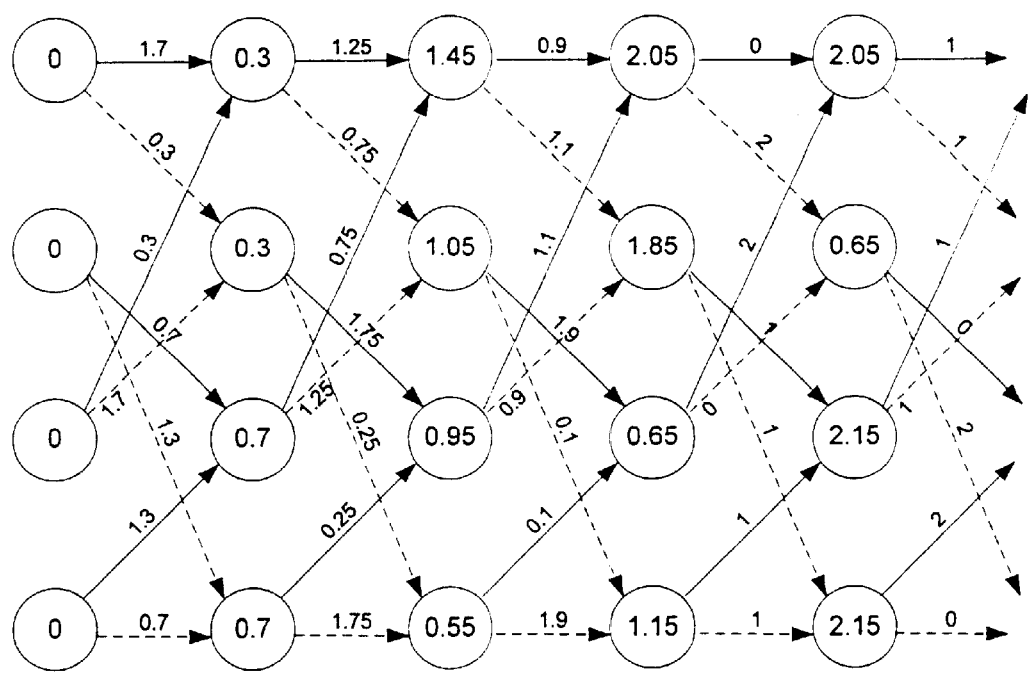
FIG. 9
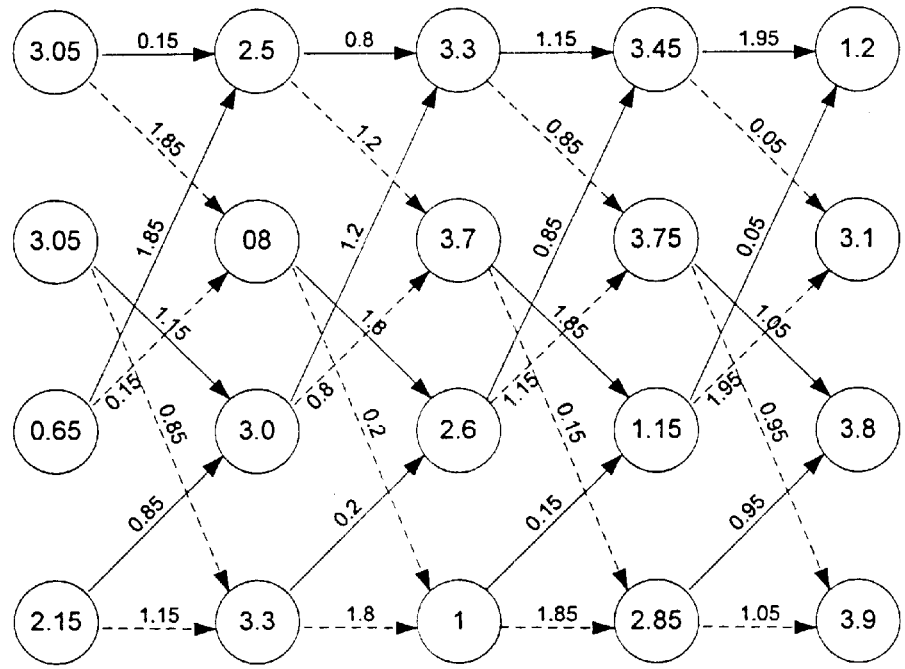

DECODING SYSTEM AND METHOD FOR DIGITAL COMMUNICATIONS

BACKGROUND OF THE INVENTION

1. Field of the Invention

The present invention relates to digital communication systems. More particularly, the invention relates to decision decoding of received digital information for use in subsequent decoding processes.

2. Background of the Related Art

The process of transmitting digital information may in one sense be thought of as a four-step process as shown in FIG. 1. First, an incoming data stream of electrical digital signals x(t) is coded by a coder 10 to produce coded information C(x(t)) that is provided to a transmitter 20 which transmits the coded information C(x(t)) over a communication medium 30. The coder 10 processes the data stream x(t) so that the coded information C(x(t)) is robust to errors; that is, errors in the coded information C(x(t)) can be detected and corrected. This is necessary because, as will be seen, the transmission process introduces a noise component into the transmitted signal which would corrupt the signal and render it useless were it impossible to be removed.

In an exemplary case, the incoming data x(t) is digitized audio such as voice or music from a known source; the coding unit 10 applies a coding transformation to the incoming data x(t) to produce the coded information C(x(t)); and the transmitter 20 modulates a radio-frequency signal with the coded data C(x(t)) to send it as a radio-frequency signal through the atmosphere which serves as the communication medium 30.

In traversing the communication medium 30, the transmitted information C(x(t)) acquires a noise component n(t), and the resultant signal x'(t)=C(x(t))+n(t) received by a receiver 40 is decoded by a decoding unit 50 to recover the original data stream.

In the above example, the receiver 40 demodulates the received radio frequency signal to produce the received coded information C(x(t))+n(t). The received coded information is error-checked and decoded by the decoding unit 50 to produce the outgoing digital data stream which might then be converted to an analog signal to be amplified for driving a speaker.

It is common in systems such as the one described above for the coder 10 to code C(x(t)) using a convolutional coding system. In contrast to a block code where a block of bits is coded according to a rule defined by the code without regard to previous inputs to the coder, a convolutional code additionally makes use of previous bits it processed in the coding process; thus, the coder 10 is a type of finite state machine.

An example of a convolutional coder of a type which might be used in the coder 10 is shown in FIG. 2A. As is evident from the coder block diagram, coding in this unit depends not only on the state of the current input bit $x_n$ but also on the state of the two previous input bits held in the two latches D. Consequently, the coder is a four-state machine as shown by its state diagram in FIG. 2B. From the state diagram it is relatively straightforward to derive the coder's trellis diagram as shown in FIG. 2C. Here, the branch to a particular state corresponding to a zero input is represented by a solid arrow, and the branch a particular state corresponding to a one input is represented by a dotted arrow.

With the trellis diagram of FIG. 2C, the coding process will be readily apparent to those skilled in the art. Applying an input vector of, e.g., X=(1 1 0 1 0 1 1) produces outputs from the coder of FIG. 2A as shown in TABLE I (assuming the coder starts from an all-zero state).

TABLE I

| Input $x_1$ | Internal State $D_1D_2$ | | Output $Y_1Y_2$ | |
|---|---|---|---|---|
| 1 | 0 | 0 | 1 | 1 |
| 1 | 1 | 0 | 0 | 1 |
| 0 | 1 | 1 | 0 | 1 |
| 1 | 0 | 1 | 0 | 0 |
| 0 | 1 | 0 | 1 | 0 |
| 1 | 0 | 1 | 0 | 0 |
| 1 | 1 | 0 | 0 | 1 |
| 0 | 1 | 1 | 0 | 1 |
| 0 | 0 | 1 | 1 | 1 |

Thus, for the coder of FIG. 2A, C(X)=(1 1 1 0 1 0 0 0 0 1 0 0 1 0 1 0 1 1).

If the communication medium 30 were error-free and the receiver 40 were assured of providing C(X) to the decoder 50, it could recover the original data stream simply by applying C(X) to the trellis network of the coder state machine and track the path therethrough which generated the sequence C(X). For example, C(X)=(1 1 1 1 0 1 0 0 0 0 1 0 0 1 0 1 0 1 1) wound be generated by the path shown in FIG. 3, where states occupied by the coder are shaded and branches taken by the coder are in bold, with the corresponding coder output C(X) given above each stage. From this, the original input sequence X=(1 1 0 1 0 1 1) can be obtained.

The above discussion and those hereinafter assume that the coder 10 and decoder 50 operate according to the same coding algorithm; that is, they both base their processing on the same coder circuit, state machine and the like; thus, dimensions of the trellis network necessary to accurately represent the coding algorithm are known to the decoder, the number of stages necessary in the trellis network is known, etc. Further, for the purposes of explanation only it is assumed that in this example the coder state machine begins in an all-zero state (this is not a requirement of real-world systems), and that the input stream X is padded with a sufficient number of zeroes to return it to such a state at the conclusion of the coding/decoding process.

Assume now that the signal received and processed by the receiver 40 has a non-zero noise component. This might result in the decoding unit 50 receiving C'(X)=(1 1 1 0 1 1 0 0 0 1 1 0 1 0 1 0 1 1), with the sixth and eleventh bits being errors due to n(t). In this case, the original input sequence cannot be found simply by applying C'(X) to the trellis of FIG. 2C. A typical error-correction algorithm used in this situation is the Viterbi error correction algorithm described as follows.

1. Given the trellis network, associate a metric with each stage in the trellis and set the metrics for all states in the first stage to zero.
2. For each state in the next stage, find the "distance" of each branch to it from the next-received subsequence of C'(X) and add it to the metric of the current state from which it branches.
3. Choose the minimum of the values calculated in Step 2 as the metric for the given stage in the next stage, and choose the branch leading to it as the survivor branch to that state.
4. Repeat Steps 2 and 3 until the end of the trellis network is reached.
5. Select the state in the last stage of the trellis network having the minimum metric and work backwards to the beginning by selecting survivor paths to produce the best guess about C(X).

If the coder is known to start from an all-zero state, the system is preferably designed so that traceback is always done to the all-zero state in the first stage. This can be done by, for example, initializing the all-zero state to zero and initializing the other states to large values.

Also, there are various techniques available to determine the state from which to begin a traceback. For example, at the end of a frame when the coder ends in a known state (in the example, 00), start the traceback from that known state.

Application of the Viterbi decoding algorithm to the corrupted stream C'(X) and the trellis network of FIG. 2C is shown in FIG. 4. Here, the metric for a state is shown at its center;

the distance of a current subsequence from a given branch is shown by a number above the branch;

survivor branches (except for those in the best guess path) have a white arrowhead; and the best guess path is in bold.

First, metrics of all states in the initial stage are set to zero. Then, the distance (here, the Hamming distance) between the subsequence 11 and each branch value is assigned to that branch. For the first node, the two branches are 00 and 11, so they receive values of 2 and 0. The next node has branches 01 and 10, so each of these branches receives a metric of 1. The third node has branches 11 and 00, so they respectively receive values of 0 and 2. Finally, the fourth node has branches 10 and 01 which each receive a Hamming distance of 1.

Then, for the first state in the second stage, the two branch values to it are 2 and 0, so its metric is set at 0 and the 0 branch from the third state in the previous stage is set as its survivor branch. For the second state in the second stage, the two branch values are 0 and 2, so its metric is set at 0 and the 0 branch from the first stage in the first stage is set as its survivor branch. Next, the third state in the second stage receives values of 1 and 1, so its metric is set to 1 and one side is randomly or deterministically set as the survivor branch. Finally, the last state in the second stage receives values of 1 and 1, so it has a metric of 1 and one branch is chosen as the survivor branch.

This process is repeated to the end of the trellis as shown in FIG. 4. Then, starting at the first node in the last stage (since it has the lowest metric of the last stage), survivor paths are traced back to the first stage. As can be seen from FIG. 4, the result is the same path travelled in the error-free case. Thus, the Viterbi algorithm has successfully eliminated the error contribution of n(t).

Although the Viterbi algorithm works well for situations such as those given above, it is not always practical to directly implement the algorithm in this way. For example, some communication systems make use of alternative information-carrying techniques such as quadrature amplitude modulation (QAM), which requires alternative methods of retrieving the received data stream.

Additionally, some communication systems make use of techniques which restrict the type of decoding systems that can be used therein. For example, soft decision decoding cannot be used with interleaved systems such as IEEE 802.11a and other OFDM systems because each bit was transmitted as part of a different constellation.

SUMMARY OF THE INVENTION

In view of the above deficiencies of the prior art, it is an object of the present invention to provide a digital information decoding system which can be used in a wide variety of communication systems.

It is another object of the present invention to provide a digital information decoding system that can be used with a wide variety of information demodulation techniques.

It is a further object of the present invention to provide a digital information decoding system that can be used with interleaving digital communication systems.

The above objects are achieved according to a first aspect of the present invention by providing a Viterbi decoding system which interprets bits in received QAM constellations as many-valued parameters rather than binary valued parameters. It performs the Viterbi algorithm using these many-valued parameters to provide results superior to hard decision decoding. Rather than applying a hard 0–1 function to the QAM data, the system uses a non-stepped linear or curved transfer function to assign values to the bits.

BRIEF DESCRIPTION OF THE DRAWINGS

These and other objects, features and advantages of the present invention are better understood by reading the following detailed description of the preferred embodiment, taken in conjunction with the accompanying drawings, in which:

FIGS. 7A and 7B show transfer curves corresponding to the decoding functions of FIGS. 6A and 6B;

FIGS. 8A and 8B show transfer curves according to a first preferred embodiment of the present invention;

FIG. 9 shows use of a trellis network in decoding a QAM output data stream having errors.

DETAILED DESCRIPTION OF PRESENTLY PREFERRED EXEMPLARY EMBODIMENTS

The above arrangement works relatively well if the digital information is used to modulate the carrier signal directly; however, this is not always the case. For a variety of reasons, some communication systems employ alternative arrangements. For example, the IEEE 802.11a communication standard uses a quadrature amplitude modulation (QAM) system in which the modulated carrier signal does not directly correspond to the information being transmitted, but to a position in a two-dimensional array or "constellation" of possible binary values. This constellation is known to the sender and receiver, so that a position transmitted to a receiving station can be accurately correlated with a corresponding digital sequence in the constellation.

Figure 5:
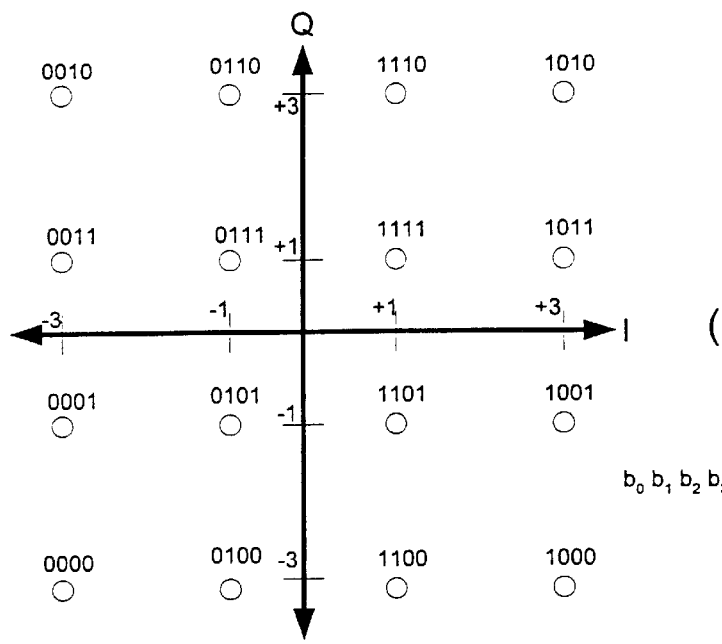
FIG. 5 shows a QAM constellation according to the prior art.

Consider FIG. 5. This is a constellation which might be used in a 16QAM (16 bit quadrature amplitude modulation) coding system. Here, rather than providing a single digital output to the decoder 50, the receiver 40 would generate two signals I and Q. So, a data point (I, Q) P of, e.g., (1, −3) would correspond to the binary sequence 1100. This sequence 1100 could then be applied to the Viterbi trellis as a received subsequence as described above.

In this case, noise effects from the communication medium 30 could vary I and Q so that they do not point directly to the appropriate constellation point. For example, rather than (1, −3) the receiver 40 may generate a data point P' of (1.25, −2.75). This may be dealt with using either a hard decision decoding process or a soft decision decoding process.

In the soft decision decoding process, a Euclidean distance measurement is used to determine the constellation point corresponding to the received (I, Q) point. For P'= (1.25, −2.75), the distances are $$D_{1100}=\sqrt{(1.25-1)^2+(-2.75+3)^2}\approx 0.35$$

$$D_{1000}=\sqrt{(1.25-3)^2+(-2.75+3)^2}\approx 1.77$$

$$D_{1101}=\sqrt{(1.25-1)^2+(-2.75+1)^2}\approx 1.77$$

$$D_{1001}=\sqrt{(1.25-3)^2+(-2.75+1)^2}\approx 2.47$$

and so on with increasing distances. Then, the distance measures would be used for branch metrics associated with four coded bits.

Figure 6A:
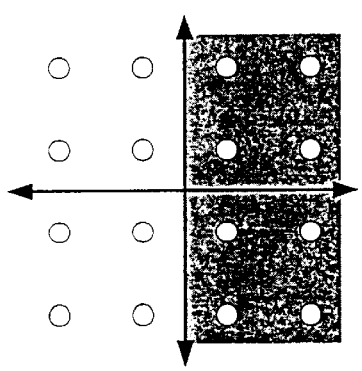
FIGS. 6A–6D show bitwise decision decoding functions for the QAM constellation of FIG. 5.

In the hard decision decoding process, a separate determination is made for each bit as to whether it is a 0 or a 1. For example, given the 16QAM constellation of FIG. 5, a hard decision metric for b0 would be $I>0 \rightarrow b_0=1$ as shown in FIG. 6A, wherein the shaded portion of the constellation indicates the area in which bit b0 should be decided to be a binary 1. A complete set of hard decision metrics would be $I>0 \rightarrow b_0=1$ (FIG. 6A)

Figure 6B:
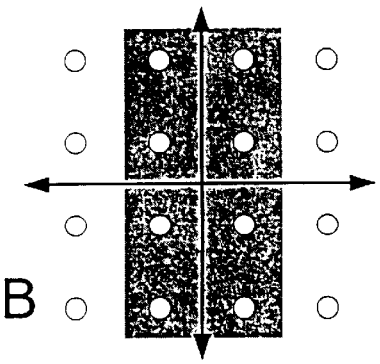

$|I|<2 \rightarrow b_1=1$ (FIG. 6B)

Figure 6C:
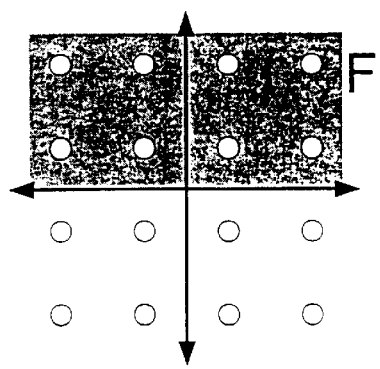

$Q>0 \rightarrow b_2=1$ (FIG. 6C)

Figure 6D:
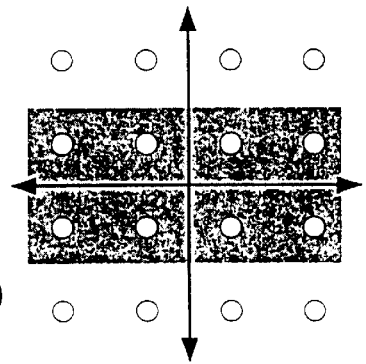

$|Q|<2 \rightarrow b_3=1$ (FIG. 6D)

The transfer curve corresponding to, e.g, FIG. 6A ($I>0 \rightarrow b_0=1$) is shown in FIG. 7A, and the transfer curve corresponding to FIG. 6B ($|I|<2 \rightarrow b_1=1$) is shown in FIG. 7B. It should be noted that in FIGS. 7A and 7B the curves are shown offset from the graph axes for illustration purposes only, and it will be understood that, e.g., FIG. 7A has a step precisely on the abscissa. It will be apparent that similar curves can be produced for FIGS. 6C and 6D.

It should be noted that as used herein, "step function" and similar terms are not intended to cover any function which has a discontinuity, rather, they are meant to cover functions in which the discontinuity spans the range of the function. That is, as used herein a function which has a discontinuity between values of 0 and 1, where 0 is the minimum value of the function and 1 is the maximum value of the function, would be considered a step function but a function digitally approximating a diagonal line reaching from 0 to 1 in steps of 0.1, e.g., 0, 0.1, 0.2 . . . would not be considered to be a step function.

As an alternative to such hard decision decoding, a preferred embodiment of the present invention uses linear functions in places of the step functions shown in FIGS. 7A and 7B. Two such functions are shown in FIGS. 8A and 8B. The curve shown in FIG. 8A is the counterpart of the curve for $b_0$ shown in FIG. 7A, and the curve shown in FIG. 8A is the counterpart of the curve for $b_1$ shown in FIG. 7B.

Similar curves apply to $b_2$ and $b_3$. As before, the curves have been offset from their respective axes for ease of explanation and preferably are not so offset in actual use. Also, the angles of the transitional portions (or, alternatively, the positions at which the transitional portions begin and end) have been chosen arbitrarily for purposes of illustration only, and are preferably selected as will be described in greater detail below.

A complete set of bitwise soft decision metrics can be derived from these graphs thusly:

$I \leq -1 \rightarrow b_0=0$ $-1<I<1 \rightarrow b_0=(I+1)/2$ $I \geq 1 \rightarrow b_0=1$ $I \leq -3 \rightarrow b_1=0$ $-3<I<-1 \rightarrow b_1=(I+3)/2$ $-1 \leq I \leq 1 \rightarrow b_1=1$ $1<I<3 \rightarrow b_1=(3-I)/2$ $I \geq 3 \rightarrow b_1=0$ $Q \leq -1 \rightarrow b_2=0$ $-1<Q<1 \rightarrow b_2=(Q+1)/2$ $Q \geq 1 \rightarrow b_2=1$ $Q \leq -3 \rightarrow b_3=0$ $-3<Q<-1 \rightarrow b_3=(Q+3)/2$ $-1 \leq Q \leq 1 \rightarrow b_3=1$ $1<Q<3 \rightarrow b_3=(3-Q)/2$ $Q \geq 3 \rightarrow b_3=0$ The above formulae may be used as is to implement the preferred embodiment; alternatively, the I and Q values could be compared to a lookup table to find the appropriate bit value (this approach becomes increasingly preferred as the complexity of the formulae increases). For example, a single table might be used for b0 and b2 and when given an I or Q value of, say, 0.75, would indicate that the corresponding bit metric is 0.875.

Figure 1:
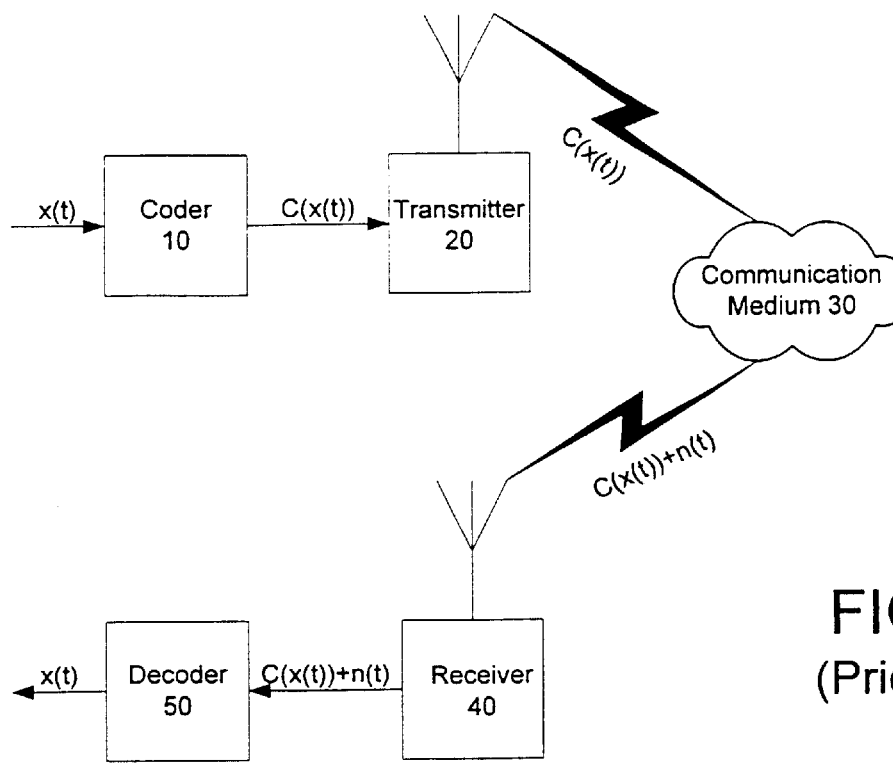
FIG. 1 is a block diagram of a digital communication system according to the prior art.
Figure 2A:
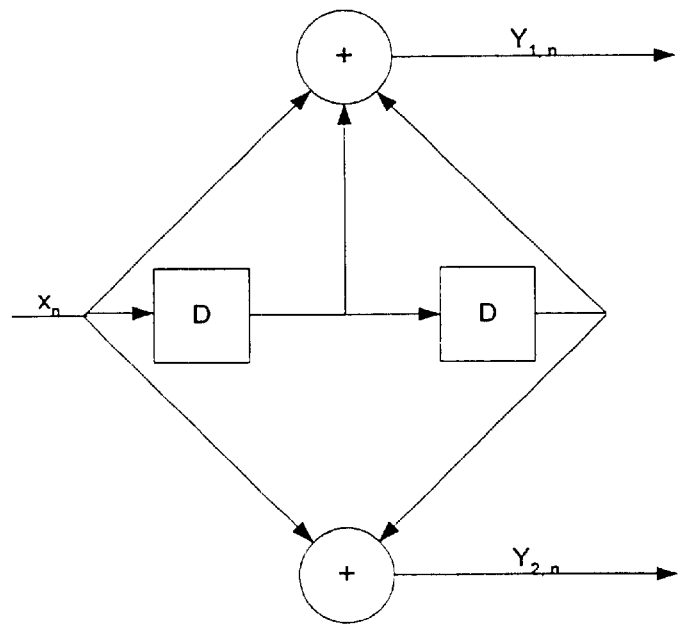
FIG. 2A is a diagram of a convolutional coder used in the system of FIG. 1.
Figure 2B:
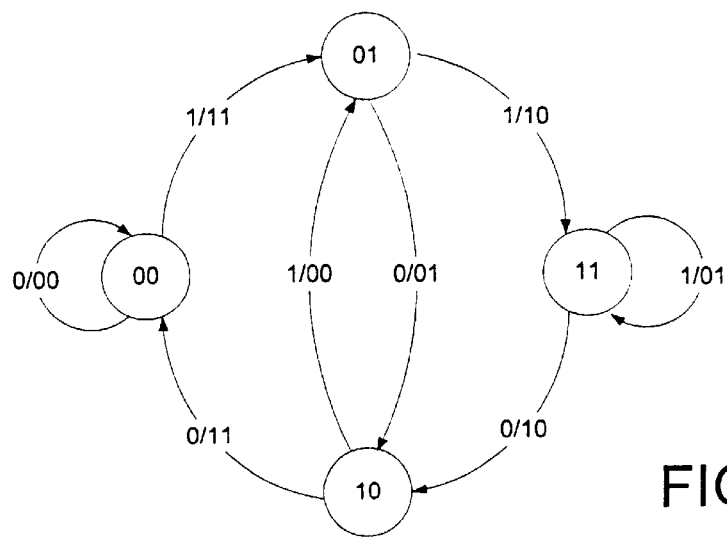
FIG. 2B is a state diagram of the coder.

The bit metrics calculated above are then used in the Viterbi decoding algorithm similarly to the above—the bits are used as received binary subsequences, and metrics of trellis branches and states are calculated therefrom. Consider the example of FIGS. 2 and 3, where in place of C(X)=(1 1 1 0 1 0 0 0 0 1 0 0 1 0 1 0 1 1)we have a 16QAM system in which the received (I, Q) pairs are [(−0.5, +1.6) (−3.4, −1.2) (−2.7, +3.2) (−0.7, −1.4) (−2.5, +0.9)], which generally corresponds to the same sequence with some noise added. Applying the above transfer functions, the following "bit" sequences are obtained:

| | |
|---|---|
| (0.7, 1, 1, 0.25) | corresponding to 1 1 1 0; |
| (0.9, 0, 0, 0) | corresponding to 1 0 0 0; |
| (0, 1, 0.15, 0) | corresponding to 0 1 0 0; |
| (0.8, 0, 1, 0.15) | corresponding to 1 0 1 0; and |
| (1, 0.95, 0.25, 0) | corresponding to 1 1 0 0. |

Figure 2C:
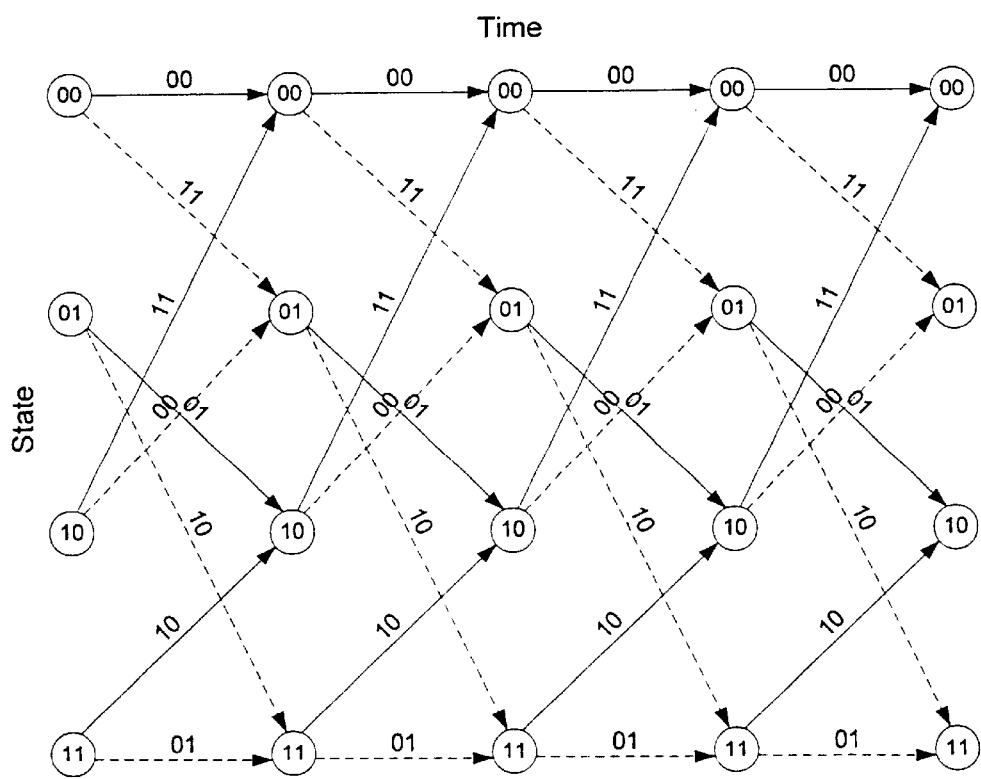
FIG. 2C is a trellis network of the coder.
Figure 3:
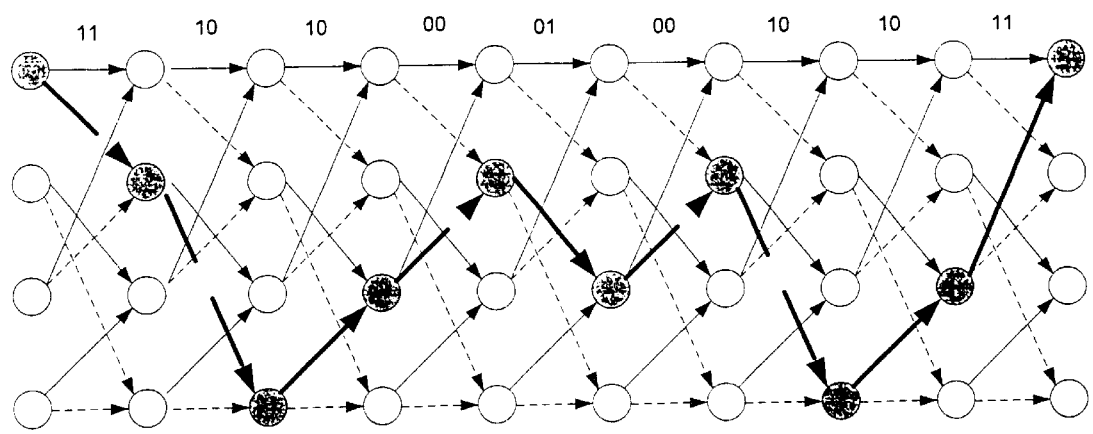
FIG. 3 shows use of the trellis network in decoding an error-free output data stream from the coder of FIG. 2.
Figure 4:
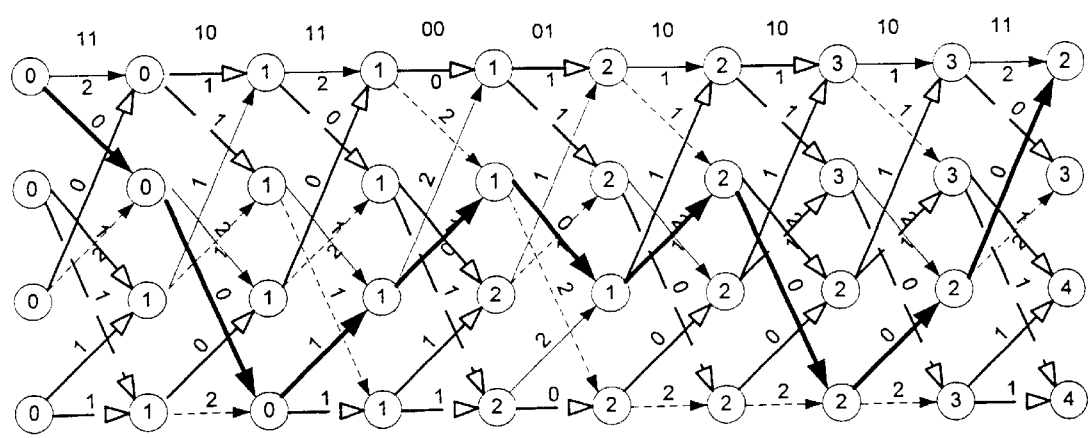
FIG. 4 shows use of the trellis network in decoding an output data stream from the coder of FIG. 2 having errors.

Applying these figures to the trellis diagram of FIG. 2C obtains the weighted trellis shown in FIG. 9. By working backward from the least-cost path in the last stage as above, the best guess state transition path of the coder 10 can be obtained, and from that the original input sequence as before.

It should be noted that although the above computations have been illustrated using the decimal system for ease of illustration, in practice it will likely be more convenient to calculate the partial bit values as n-bit binary values, with each binary step corresponding to an increase of $1/2^n$ from the next lower value. In the preferred embodiment n=4, which was chosen as a tradeoff between hardware complexity and decoder performance; other values will also prove workable.

So, a bit value of 0.5 would be represented by a value of 1000, a value of 0.8 might be rounded up to 1101 (0.8125), etc. Slightly larger accumulators can be used to store the state metrics; a six bit accumulator could be used to store any of the state metrics shown in FIG. 9. This will simplify circuitry implementing the embodiment immensely and speed it up a great deal.

Generally speaking, more than six bits might be required in the accumulator, especially when more than nine bits are decoded. Also, those of ordinary skill in the art will recognize that techniques are known for limiting the required number of state metric bits, even for frames of arbitrary length.

It will also be appreciated by those skilled in the art that a number of different fabrication technologies may be used to implement the preferred embodiment—lower throughput systems may be implemented in software, while higher throughput systems may use a hardware-oriented approach such as a custom chip, an FPGA, a gate array or the like.

Figure 10A:
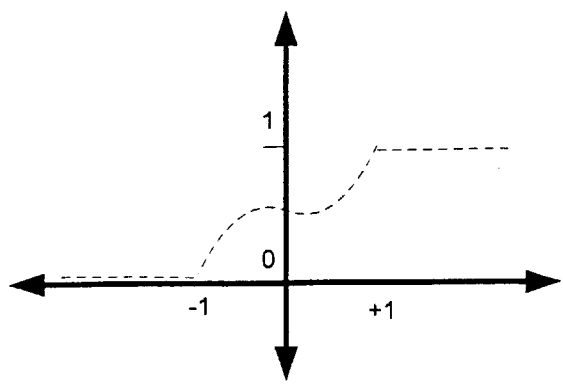
FIGS. 10A and 10B show transfer curves according to a first preferred embodiment of the present invention.

A second preferred embodiment of the present invention is similar to the first in its use of many-valued bit values; however, in the second embodiment the transitional portion of the curves are not linear but curved. FIG. 10A shows the transfer curve for $b_0$ and $b_2$, and for $b_1$ and $b_3$, corresponding to FIGS. 7A/8A and 7B/8B, respectively. The transitional portions of these curves generally can be expressed either in formulae such as those below (using the Q parameter for exemplary purposes) or, in practice, in a lookup table.

For FIG. 10A, $$Q \leq =1 \rightarrow bit=0$$

$$-1 < Q < 0 \rightarrow bit = \frac{1}{2} - \frac{Q^2}{2}$$

$$0 \leq Q < 1 \rightarrow bit = \frac{1}{2} + \frac{Q^2}{2}$$

$$Q \geq 1 \rightarrow bit=1$$

Figure 10B:
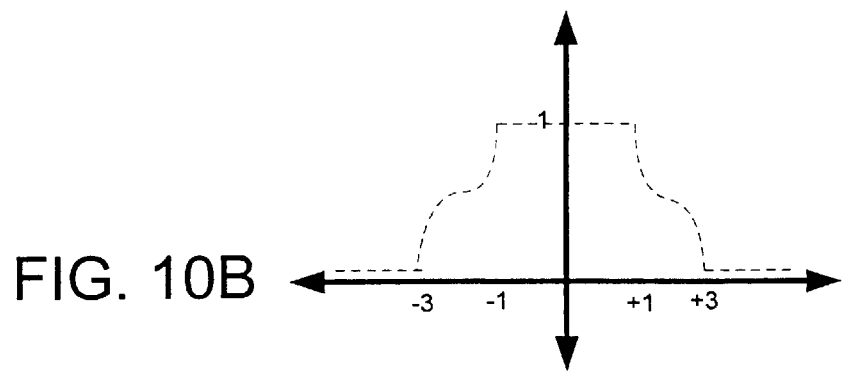

For FIG. 10B, $$Q \leq -3 \rightarrow bit=0$$

$$-3 \leq Q \leq -2 \rightarrow bit = \frac{1}{2} - \frac{(Q+2)^2}{2}$$

$$-2 \leq Q \leq -1 \rightarrow bit = \frac{1}{2} + \frac{(Q+2)^2}{2}$$

$$-1 \leq Q \leq 1 \rightarrow bit=1$$

$$1 \leq Q \leq 2 \rightarrow bit = \frac{1}{2} + \frac{(Q-2)^2}{2}$$

$$2 \leq Q \leq 3 \rightarrow bit = \frac{1}{2} - \frac{(Q-2)^2}{2}$$

$$Q \geq 3 \rightarrow bit=0$$

Tests indicate that while use of linear functions such as the one previously describe provide the largest incremental gain over prior art decoding techniques, use of nonlinear functions such as the above nonetheless provides a significant advantage over regular prior art hard decision decoding and can in fact approach the level of accuracy provided by soft decision decoding.

Of course, these formulae are only exemplary, and a wide variety of non-linear transitional curves may be used in their place. For example, having a steeper transition near the flat parts of the functions produce slightly better results than a linear transition region. Additionally, the curves may be selected based on the particular constellation involved, expected fading characteristics of the received signal, expected channel characteristics of the received signal, type of decoding (Viterbi, dynamic programming, voice recognition, etc.) and the like.

The present invention has been described above in connection with a preferred embodiment thereof; however, this has been done for purposes of illustration only, and the invention is not so limited. Indeed, variations of the invention will be readily apparent to those skilled in the art and also fall within the scope of the invention. For example, the invention has been explained above in the context of an OFDM system such as one adhering to the IEEE 802.11a standard which cannot implement soft decision decoding because it uses interleaving after coding; however, the invention is not so limited. For example, it need not be implemented in connection with QAM modulation techniques and can be implemented in connection with almost any shape of constellation, such as eight phase modulation. It can be used with almost any non-binary multilevel modulation system, and can be implemented in connection with QPSK systems and BPSK systems as well, where it reduces the computational complexity of the system.

Further, the system is applicable and advantageous in almost any system in which soft decision decoding cannot be used for one reason or another. Particularly, it is applicable:

in situations having a very low latency requirement;
if certain decoded bits are needed faster;
where a lower computational complexity is required;
systems employing interleaving and other similar techniques;
systems where different users use different bits of the same symbol, to avoid using different decoders for each user; and
any system in which it is desirable to treat different bits in different ways.

Such variations are to be understood as being within the scope of the present invention.

What is claimed is:

1. A digital information decoding system comprising:
   first means for receiving data indicative of a sequence of digital information and determining a sequence of parameters therefrom by applying a non-step formula with a non-linear term to a portion of the data indicative of digital information, each of the parameters having at least ee possible values; and second means for decoding the sequence of digital information based on the sequence of parameters.

2. The system of claim 1, wherein the sequence of digital information is a sequence of bits, and the data indicative thereof is quadrature amplitude modulation data.

3. The system of claim 1, wherein the first means includes means for determining the sequence of parameters using a lookup table specifying a non-step correspondence between a portion of the data indicative of digital information and a parameter in the sequence of parameters.

4. The system of claim 1, wherein the second means is means for Viterbi decoding the sequence of digital information from the sequence of parameters.

5. A digital information decoding system comprising:

first means for receiving data indicative of a sequence of digital information and determining a sequence of parameters therefrom by using a non-step transfer curve with a non-linear segment in conjunction with a portion of the data indicative of digital information, each of the parameters having at least three possible values; and second means for decoding the sequence of digital information based on the sequence of parameters.

6. The system of claim 5, wherein the first means includes means for determining the sequence of parameters using a lookup table specifying a non-step correspondence between a portion of the data indicative of digital information and a parameter in the sequence of parameters.

7. The system of claim 5, wherein the second means is means for Viterbi decoding the sequence of digital information from the sequence of parameters.

8. A digital information decoding system comprising:

first means for receiving data indicative of a sequence of digital information and determining a sequence of parameters therefrom by applying a formula in which an intercept point will not correspond to a bit constellation point of a bit-transition boundary; and second means for decoding the sequence of digital information based on the sequence of parameters.

9. The method of claim 8, wherein the first means includes means for determining the sequence of parameters using a lookup table specifying a non-step correspondence between a portion of the data indicative of digital information and a parameter in the sequence of parameters.

10. The method of claim 8, wherein the second means is means for Viterbi decoding the sequence of digital information from the sequence of parameters.

11. The system of claim 8, wherein the sequence of digital information is a sequence of bits, and the data indicative thereof is quadrature amplitude modulation data.

12. The system of claim 8, wherein the first means applies a linear formula as the formula.

13. The system of claim 8, when the first means applies a non-step formula with a non-linear term as the formula.

14. The system of claim 8, wherein the first means uses a lookup table specifying a non-step correspondence between a portion of the data indicative of digital information and a parameter in the sequence of parameters.

15. The system of claim 8, wherein the second means includes means for Viterbi decoding the sequence of digital information from the sequence of parameters.

16. A digital information decoding method comprising:

receiving data indicative of a sequence of digital information;

determining a sequence of parameter therefrom by applying a non-step formula with a non-linear term to a portion of the data indicative of digital information, each of the parameters having at least tree possible values; and decoding the sequence of digital information based on the sequence of parameters.

17. The method of claim 16, wherein the sequence of digital information is a sequence of bits, and the data indicative thereof is quadrature amplitude modulation data.

18. A digital information decoding method comprising:

determining a sequence of parameters therefrom using a non-step transfer curve with a non-linear segment in conjunction with a portion of the data indicative of digital information, each or the parameters having at least Three possible values; and decoding the sequence of digital information based on the sequence of parameter.

19. The method of claim 18, wherein the step of determining the sequence of parameters uses a lookup table specifying a non-step correspondence between a portion of the data indicative of digital information and a parameter in the sequence of parameters.

20. The method of claim 18, wherein the step of decoding Viterbi decodes the sequence of digital information from the sequence of parameters.

21. A digital information decoding method comprising:

receiving data indicative of a sequence of digital information;

determining a sequence of parameters therefrom by applying a formula in which an intercept point will not correspond to a bit constellation point of a bit-transition boundary; and decoding the sequence of digital information based on the sequence of parameters.

22. The method of claim 21, wherein the sequence of digital information is a sequence of bits, and the data indicative thereof is quadrature amplitude modulation data.

23. The method of claim 21, wherein the step of determining applies a linear formula as the formula.

24. The method of claim 21, wherein the step of determining applies a non-step formula with a non-linear term as the formula.

25. The method of claim 21, wherein the step of determining the sequence of parameters uses a lookup table specifying a non-step correspondence between a portion of the data indicative of digital information and a parameter in the sequence of parameters.

26. The method of claim 21, wherein tee step of decoding Viterbi decodes the sequence of digital information from the sequence of parameters.

* * * * *

UNITED STATES PATENT AND TRADEMARK OFFICE
CERTIFICATE OF CORRECTION

PATENT NO. : 6,507,619 B1
APPLICATION NO. : 09/535902
DATED : January 14, 2003
INVENTOR(S) : John S. Thomson et al.

It is certified that error appears in the above-identified patent and that said Letters Patent is hereby corrected as shown below:

Column 1, line 64, insert -- to -- after "branch".

Column 2, line 1, replace "X" with -- $\underline{\mathbf{X}}$ --.

Column 2, TABLE I, replace "$Y_1Y_2$" with -- $y_1y_2$ --.

Column 2, line 17, replace "C(X)" with -- C($\underline{\mathbf{X}}$) --.

Column 2, line 20, replace "C(X)" with -- C($\underline{\mathbf{X}}$) --.

Column 2, line 22, replace "C(X)" with -- C($\underline{\mathbf{X}}$) --.

Column 2, line 24, replace "C(X)" (first occurrence) with -- C($\underline{\mathbf{X}}$) --.

Column 2, line 24, replace "C(X)" with -- C($\underline{\mathbf{X}}$) --.

Column 2, line 24, replace "=(1111010000" with -- =(111010000 --.

Column 2, line 25, replace "wound" with -- would --.

Column 2, line 28, replace "C(X)" with -- C($\underline{\mathbf{X}}$) --.

Column 2, line 29, replace "X" with -- $\underline{\mathbf{X}}$ --.

Column 2, line 40, replace "X" with -- $\underline{\mathbf{X}}$ --.

Column 2, line 45, replace "C'(X)" with -- C'($\underline{\mathbf{X}}$)--.

Column 2, line 48, replace "C'(X)" with -- C'($\underline{\mathbf{X}}$) --.

Column 2, line 58, replace "C'(X)" with -- C'($\underline{\mathbf{X}}$) --.

Column 3, line 2, replace "C'(X)" with -- C'($\underline{\mathbf{X}}$) --.

Column 3, line 13, replace "C'(X)" with -- C'($\underline{\mathbf{X}}$) --.

Column 5, line 31, replace "b0" with -- $b_0$ --.

Column 5, line 33, replace "b0" with -- $b_0$ --.

Column 5, line 42, delete paragraph indent.

UNITED STATES PATENT AND TRADEMARK OFFICE
CERTIFICATE OF CORRECTION

PATENT NO. : 6,507,619 B1
APPLICATION NO. : 09/535902
DATED : January 14, 2003
INVENTOR(S) : John S. Thomson et al.

It is certified that error appears in the above-identified patent and that said Letters Patent is hereby corrected as shown below:

Column 5, line 63, replace "places" with -- place --.

Column 5, line 66, replace "8A" with -- 8B --.

Column 6, line 44, replace "b0 and b2" with -- $b_0$ and $b_2$ --.

Column 6, line 51, replace "C(X)" with -- C($\underline{X}$) --.

Column 6, line 66, delete paragraph indent.

Column 7, replace first equation with -- $Q \leq 1 \rightarrow bit = 0$ --.

Column 8, line 10, delete paragraph indent.

Column 8, line 11, replace "describe provide" with -- described provides --.

Column 9, line 2, replace "ee" with -- three --.

Column 9, line 56, replace "when" with -- wherein --.

Column 10, line 7, replace "parameter" with -- parameters --.

Column 10, line 10, replace "tree" with -- three --.

Column 10, line 21, delete "the".

Column 10, line 22, replace "or" with -- of --.

Column 10, line 23, replace "Three" with -- three --.

Column 10, line 25, replace "parameter" with -- parameters --.

UNITED STATES PATENT AND TRADEMARK OFFICE
CERTIFICATE OF CORRECTION

PATENT NO.         : 6,507,619 B1
APPLICATION NO. : 09/535902
DATED               : January 14, 2003
INVENTOR(S)       : John S. Thomson et al.

It is certified that error appears in the above-identified patent and that said Letters Patent is hereby corrected as shown below:

Column 10, line 57, replace "tee" with -- the --.

Signed and Sealed this

Fifth Day of June, 2007

JON W. DUDAS
*Director of the United States Patent and Trademark Office*